United States Patent [19]

Marquardt et al.

[11] 3,940,289
[45] Feb. 24, 1976

[54] FLASH MELTING METHOD FOR PRODUCING NEW IMPURITY DISTRIBUTIONS IN SOLIDS

[75] Inventors: Charles L. Marquardt, Oxon Hill; John F. Giuliani, Kensington, both of Md.

[73] Assignee: The United States of America as represented by the Secretary of the Navy, Washington, D.C.

[22] Filed: Feb. 3, 1975

[21] Appl. No.: 546,472

[52] U.S. Cl.................................. 148/1.5; 357/91
[51] Int. Cl.² ........................................ H01L 21/268
[58] Field of Search.......................... 148/1.5; 357/91

[56] References Cited
UNITED STATES PATENTS

| | | |
|---|---|---|
| 3,361,597 | 1/1968 | Sharpless ............................ 148/1.5 |
| 3,369,101 | 2/1968 | Curcio ........................... 148/1.5 UX |
| 3,748,597 | 7/1973 | Reinhart ....................... 148/1.5 UX |

*Primary Examiner*—R. Dean
*Assistant Examiner*—J. M. Davis
*Attorney, Agent, or Firm*—R. S. Sciascia; Arthur L. Branning; Thomas McDonnell

[57] ABSTRACT

An impurity concentration profile is established in a solid by attaching the solid to a heat sink and irradiating it with one or more fast laser pulses. The impurity may initially be located in a surface layer or it may be dispersed throughout the solid.

7 Claims, 11 Drawing Figures

FLASH MELTING METHOD FOR PRODUCING NEW IMPURITY DISTRIBUTIONS IN SOLIDS

BACKGROUND OF THE INVENTION

This invention relates generally to producing impurity concentration profiles in solids and particularly to methods of producing semiconductor devices and optical waveguides.

Establishing an impurity concentration profile in a solid, and particularly a buried layer of impurity, has usefulness in many fields. For example, a semiconductor material with a buried layer of a substance with different electrical properties would be useful in semiconductor circuits. A buried layer with a different index of refraction than the host material could be utilized in producing optical waveguide devices.

In preparation of semiconductor devices, a wide variety of techniques have been used to produce impurity profiles. They fall into three major catagories:

a. Variation of crystal growing conditions
b. Diffusion methods
c. Ion implantation Of these, only ion implantation is capable of producing thin layer profiles near the surface of samples. Ion implantation has also been successful in producing layer structures required for optical waveguides. Nevertheless it has the drawback that the bombardment also causes damage to the sample, in the form of various lattice defects. Another difficulty has been that the incident ions do not all incorporate into the material in the same manner, some being substitutional and other occupying interstitial positions and defect sites. Besides these operational problems there is also the practical consideration that ion implantation requires and expensive accelerator and technical expertise not available in most facilities.

Other methods of producing optical waveguides include sputtering, evaporation, liquid phase epitaxy, plasma polymerization and ion exchange. The last of these is capable of producing buried layers, as is ion implantation. However the layers produced by ion exchange are typically about an order of magnitude thicker than those produced by implantation. The ion exchange method has the drawbacks that it typically requires several hours of processing, involves the use of molten salt baths and is only feasible in certain chemical systems.

It is therefore an object of this invention to provide a method for establishing one or more layer profiles in a solid which is fast, simple, inexpensive, and versatile.

Also, an object of this invention is to provide a method of establishing a greater variety of profiles in solids which may be tailored to specifc applications.

Another object of this invention is to provide a method of establishing layer profiles in solids which utilizes a fast laser pulse.

Another object of this invention is to provide a method of producing small local regions of impurity penetration in a large extended solid sample.

Yet another object of this invention is to provide a method of establishing impurity layer profiles in solids which can be controlled so as to produce minimum damage to crystalline materials.

And yet another object of this invention is to provide a method of establishing impurity layer profiles at an accurate depth in a solid.

Also, an object of this invention is to provide a method of establishing impurity layer profiles in solids which can be carried out at atmospheric pressure.

And another object of this invention is to provide a method of establishing impurity layer profiles which have variable concentrations.

And a further object of this invention is to provide a method of producing concentration profiles using a process having a duration of less than 1 $\mu$s.

These and other objects are achieved by attaching a solid with an impurity to a heat sink and flash melting the solid by short low energy laser pulses whereby a freezing interface passes from the heat sink into the interior of the solid which causes the impurity to move into the interior of the solid with a particular concentration profile.

DETAILED DESCRIPTION OF THE INVENTION

Segregation coefficient K is defined as the ratio of the equilibrium solubility of a dopant in the solid phase $C_s$ to that in the liquid phase $C_L$ at the melting point of the host material. Mathematically the segregation coefficient is expressed as $K = C_s/C_L$. If the segregation coefficient is different from one, the dopant segregates into either the liquid phase or the solid phase at a freezing interface depending on whether the segregation coefficient is less than or greater than one. For a flash melted solid through which a freezing interface is passing, a dopant is moved principally by segregation at the moving interface and to a lesser degree by diffusion induced by the elevated temperature in the liquid phase.

Figure 1:
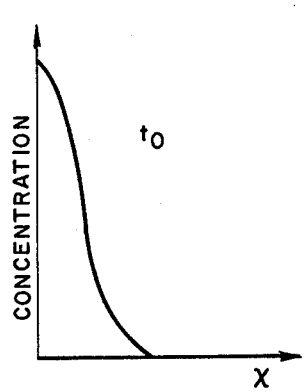
FIGS. 1–4 are a schematic representation of establishing an impurity concentration profile in a solid from an enriched layer of the impurity.
Figure 2:
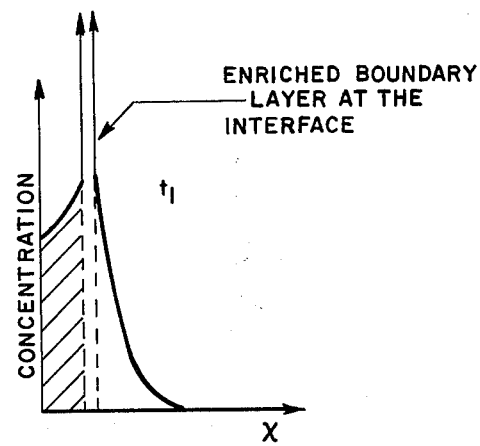
Figure 3:
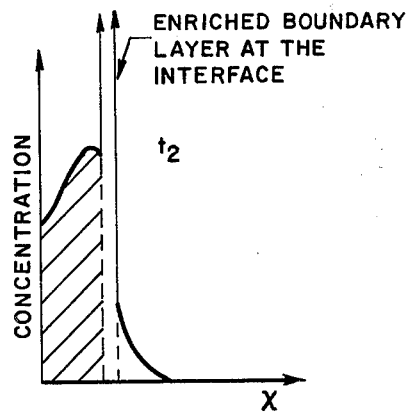
Figure 4:
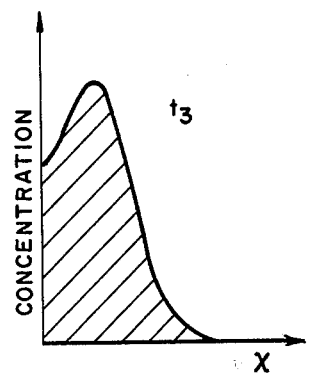

It has been discovered that if the segregation coefficient of the impurity differs from one by at least a factor of about three, if the correct laser pulse is selected to flash melt the solid, and if good thermal contact is made with a heat sink, a freezing interface is produced and the segregation of the impurity at the freezing interface significantly exceeds the diffusion of the impurity into the solid. Thus a well defined concentration of the impurity is produced in the interior of the solid. The mechanism by which an impurity concentration is moved by the process of this invention is schematically represented in FIGS. 1–4 for a solid in which an impurity is concentrated in a layer at the surface in contact with a heat sink. FIG. 1 shows the impurity concentration in relation to the distance from the heat sink contact at the moment the solid is flash melted. FIGS. 2 and 3 show the change in the concentration profile as the liquid-solid interface progresses from the heat sink towards the interior of the solid. FIG. 4 shows the new impurity concentration profile in the solidified sample.

A one-dimensional mathematical model for the change in the impurity concentration profile effected by the present process is given by the following equation:

$$C_s(x) = \frac{K}{\delta} \left\{ \int_0^{x+\delta} C_0(x')dx' - \lim_{\epsilon \to 0} \int_0^{x-\epsilon} C_s(x')dx' \right\}$$

wherein $x$ = distance from the start of the freezing interface;
$x'$ = dummy variable;
$C_s(x)$ = the concentration of a solute at point x, i.e., impurity in a solid after freezing;
$C_0(x)$ = the initial concentration of the solute at point $x$ in the solid;
$K$ = the ratio of the solubility of a solute in the solid phase to that in the liquid phase;
$\delta$ = the thickness of an enriched layer of higher solute concentration in the liquid at the freezing interface;
$\epsilon$ = a small neighborhood around $x$ which is excluded from the integral in order to ensure convergence.

Greater detail as to the above formula can be found in Marquardt, C.L., et al, *Observation of Impurity Migration in Laser-Damaged Junction Devices*, Radiation Effects, Vol. 23, p. 135–139, 1974.

Figure 5:
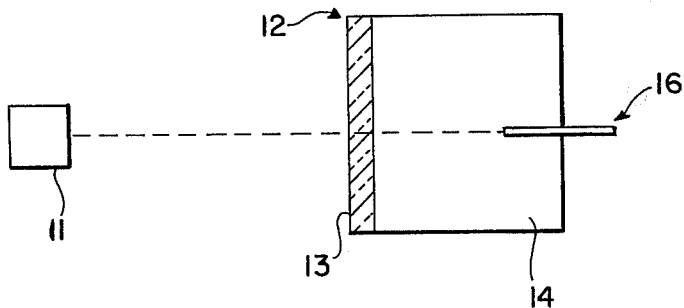
FIG. 5 is a diagrammatic view of an apparatus of the invention.

An apparatus for establishing an impurity layer profile in a solid in accordance with the present invention is shown diagrammatically in FIG. 5. This apparatus or comparable equipment comprises, basically a laser 11 and a sample chamber 12. Since the heat pulse must only produce localized melting in the solid, a single mode laser should be used. Also, the laser must be capable of producing short pulses which for the case of silicon irradiated by a 1.06μ laser, would be on the order of 22 nanoseconds. The spectral characteristic of the laser must match the infrared absorption range of the solid-solute system.

The sample chamber 12 as is shown in FIG. 5 further comprises a window 13 made from any material which is transparent to the emitted laser beam, such as quartz or an alkali halide. Inside the sample holder 12, an inert atmosphere 14 comprising argon, or helium, or nitrogen, or the like is maintained. If a heat sink such as a block of copper is not located inside the sample chamber, a heat sink conductor 16 is used to thermally connect the solid to a heat sink (not shown in FIG. 5). Any material which has a high thermal conductivity may be used for the heat sink conductor 16. Preferably the conductor has sufficient structural strength to suspend itself and the solid in the sample chamber without the need of supports. Examples of suitable heat sink conductor would be a thick copper wire or a bundle of thin copper wires. Of course, silver, gold, or the like may be used instead of copper. The actual dimensions of the conductor would depend on the size and type of solid being irradiated. What is being sought from the heat sink is the conduction of heat away from the contacted face of the solid thereby producing a temperature gradient between the interior and the edge.

Figure 6:
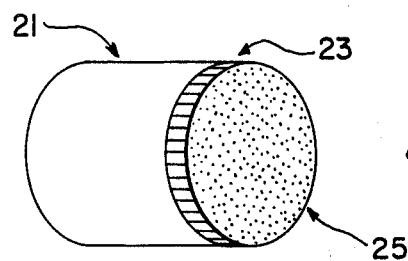
FIG. 6 is a diagrammatic cross section of a typical solid.

FIG. 6 is a diagrammatic cross section of a typical solid 21 which may be treated according to the practice of the present invention. The solid may have an enriched layer 23 containing the impurity from which the impurity concentration profile is formed and a heat sink contact 25. The solid may be any elemental solid. Alloys and compounds could be used if phase separation could be prevented during the melting and refreezing. Preferably the solid would be composed of an elemental semiconductor material. As was previously mentioned the infrared absorption of the solid must be compatible with the spectral characteristics of the laser. Excellent examples of suitable solid material, especially for semiconductor and infrared waveguide applications, are silicon and germanium. The shape and size of the solid are not critical to the practice of this invention, their selection would depend on the intended use of the solid.

Preferably for waveguide semiconductor applications, the solid has an enriched layer of an impurity which is no more than about one-fourth, and most preferably less than one-tenth of the total thickness of the sample and which has an impurity density of about $10^{14}$ to about $10^{18}$ with $10^{15}$ to $10^{17}$ atoms of impurity per cubic centimeter of solid most preferred.

The enriched layer may be established by any method. The method and apparatus of the present invention may be adapted to produce the enriched layer or any of the numerous techniques of doping a solid may also be used. For example, the methods described in Marsden, Charles P., *Silicon Device Processing*, National Bureau of Standards Special Publication 337, November 1970, could be used to establish the initial enriched layer 25.

Any impurity may be selected so long as the segregation coefficient thereof in the solid differs from 1 by a factor greater than or equal to 3. The speed and quality of concentrating the impurity into a particular profile is proportional to the variance of the segregation coefficient from 1. The segregation coefficient for a particular dopant and host may be determined by simple laboratory procedures or by an appropriate reference book. For example the segregation coefficients for numerous impurities in germanium or silicon are found in Trumbore, F.A., *Solid Solubilities of Impurity Elements in Germanium and Silicon*, in the Bell System Tech. Jour. 39:p. 207, January 1960.

The heat sink contact 25 of FIG. 6 is in good thermal contact with the solid 2 and has a high thermal conductivity. Thus there cannot be a barrier layer between the heat sink contact and the solid. One technique for accomplishing the contact is to alloy a metal such as nickel, silver, and the like onto the solid. The silicon on sapphire technology could also be utilized. This technique would involve depositing a doped layer of Si onto a sapphire substrate and subsequently depositing a layer of pure Si. The sapphire would then be used for heat sinking. This arrangement would have the further advantage that the transparency of the sapphire would allow direction of the laser beam through the heat sink.

Figure 8:
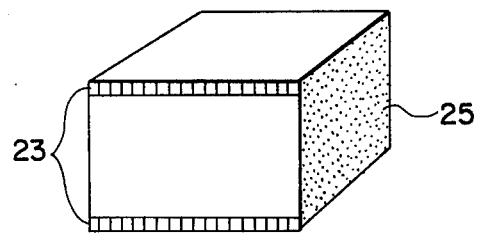
FIG. 8 is a diagrammatic cross section of a typical solid with two enriched layers.
Figure 7:
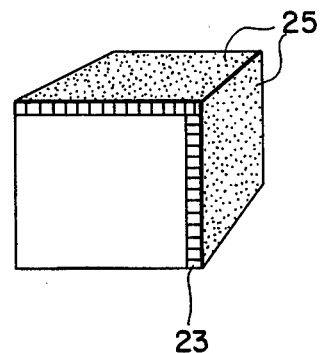
FIG. 7 is a diagrammatic cross section of a typical solid with two heat sink contacts.

In the practice of this invention it is possible to utilize more than one heat sink contact or more than one enriched layer. FIG. 7 and FIG. 8 show two such possibilities.

In carrying out the method of this invention, a host material 21 is selected according to the previously stated principles. After one or more heat sink contacts 25 are affixed to the solid, it is placed inside the sample holder 12. The heat sink contact(s) is connected to a heat sink or heat sink conductor. It is preferred that the broad surface of the enriched layer if one is present, is not the surface which receives the laser beam. Gas is then admitted into the sample holder at a pressure of about one atmosphere and the temperature is set to around 20°C. Since the sole purpose of the inert atmosphere and controlled temperature is to provide a protective environment to prevent oxidation of the surface of the solid, any pressure and temperature which would prevent the undesired oxidation would be suitable.

The laser 11 is adjusted to produce a laser pulse with an energy density per unit area from about E to about 1.5E $$\text{where } E = \frac{\Delta T_{th}\, \rho\, c}{(1-R)\alpha},$$

wherein:
$\Delta T_{th}$ = the melting point of the solid;
$\rho$ = density of the solid;
$c$ = specific heat of the solid;
$R$ = reflectivity of a surface of the solid; and
$\alpha$ = absorption coefficient of the doped layer of the solid being irradiated.

Preferably the energy density per unit area is from 1.05E to 1.25E. Generally the energy density would equal 1.1E, although for some materials and dopants, it is possible to exceed 1.5E. For purposes of adjusting the laser 11 according to the practice of the present invention, the values of $\Delta T_{th}$, $\rho$, $c$, and $R$ are those of the solid without impurities. However, the value used for $\alpha$ must be that of the doped region regardless of whether the doped region is a layer or the entire solid with a dispersed impurity. These values may be found in appropriate references for widely used solids such as silicon and germanium with common impurities, e.g., phosphorus, arsenic, or nickel. Otherwise the value can be determined by standard laboratory techniques and equipment such as spectrophotometer.

The laser pulse time to be used is equal to $\tau = 1/10$ to $1/1000\ (4/\pi\alpha^2 k)$ wherein $\alpha$ = absorption coefficient of the surface of the solid being irradiated and $k$ = thermal diffusivity of the solid. For purposes of adjusting the laser 11, the value of $k$ for a pure solid may be used, but for $\alpha$, the actual value of the doped region must be used in the calculations for the pulse time. Preferably $\tau$ would equal $1/100\ (4/\pi\alpha^2 k)$ or $1/(25\pi\alpha^2 k)$ for semiconductor and waveguide components.

The above two formulas are derived from the teachings disclosed in Bartoli, et al, Laser Damage in Triglycine Sulfate: Experimental Results and Thermal Analysis, J. Appl. Phys. 44(8), pp. 3713–3720, August 1973.

Further the laser is adjusted so that the wavelength of the laser pulse overlaps the intrinsic absorption of the host material.

The number of laser pulses depends on the materials used and the impurity concentration profile sought. The effects of a poor segregation coefficient, e.g. one that differs from 1 by a factor of 2.9 may be corrected by increasing the number of laser pulses.

In order to demonstrate the operability of the present process the following two examples are given. The experiments were performed on 1N2175 NPN graded junction phototransistors which have an initial phosphorus concentration profile similar to FIG. 9 which is a composite of many tested phototransistors. These phototransistors were fabricated by diffusion of phosphorus into both ends of a boron-doped silicon wafer. The characteristics were studied before and after laser irradiation by optical spot profile measurements and electron microprobe analysis. The impurity concentration profile was established by the focused beam of a neodymium glass laser capable of generating a q-switched pulse of about 22 nsec duration, delivering a maximum of 12 mj per pulse over less than a 1 mm-diam focal spot. Pulses of lesser energy were obtained by attenuating the beam. A scanning focused helium-neon laser beam about 0.025 mm in diameter was used to map the photoresponse of the surfaces (spot profile), and an ARL Model EMX-SM 121000-10 scanning electron beam microprobe with a 0.2 mm beam diameter was employed to determine the phosphorus distributions. The fact that the melting point had been exceeded was verified by microscopic inspection of the phototransistor afterwards.

EXAMPLE I

For the first phototransistor, $\tau$ was approximately $3 \times 10^{-6}$ sec, $\delta = 0.2\mu m$, and $K = 0.25$. The experimental results are given in FIG. 10 along with the values calculated by the aforegiven formula.

EXAMPLE II

Figure 11:
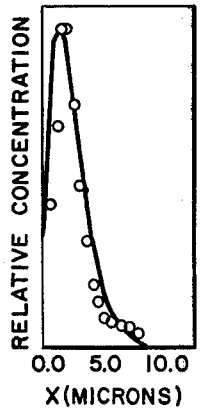

The previous experiment was repeated with a second phototransistor in which $\tau$ is about $2 \times 10^{-4}$ sec, $\delta$ is 0.4 $\mu m$, and $K$ is 0.30. FIG. 11 compares the results of this experiment with the theoretical results as calculated by the aforegiven equation.

Figure 9:
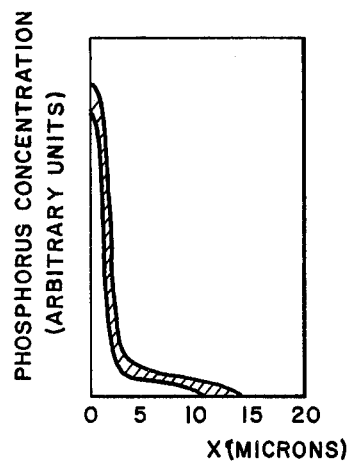
FIG. 9 is a composite of typical phosphorus concentration profiles in 1N2175 NPN graded-junction phototransistors.
Figure 10:
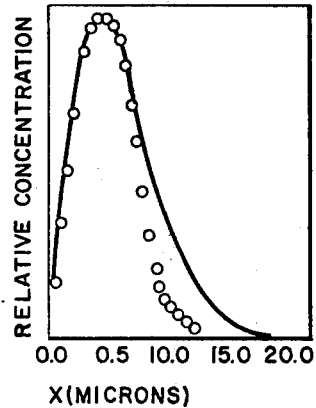
FIGS. 10 and 11 are the experimental results of examples 1 and 2.

As can be seen from FIGS. 9–11 the method encompassed by this invention provides an effective technique for establishing an impurity concentration profile in a solid at a position more interior than the original impurity concentration profile. Further the one-dimensional model given previously gives remarkably accurate results.

Obviously many modifications and variations of the present invention are possible in light of the above teachings. It is therefore to be understood that, within the scope of the appended claims, the invention may be practiced otherwise than as specifically described.

What is claimed and desired to be secured by Letters Patent of the United States is:

1. A method of establishing an impurity concentration profile in a solid which comprises:
   placing a solid with an impurity which has a segregation coefficient different from 1 by a factor greater than about 3 in an inert atmosphere;
   attaching said solid to a heat sink;
   flash melting said solid by a laser pulse with a duration from 1/10 to 1/1000 $\tau$ and an energy area density from E to 1 1/5E; and
   allowing said solid to resolidify, thereby causing a freezing interface to pass through said solid.

2. The method of claim 1 wherein said solid is attached to a plurality of heat sinks.

3. The method of claim 1 wherein said laser pulse has a duration of 1/100 $\tau$ and an energy area density from 1.05E to 1.25E.

4. The method of claim 3 wherein said laser pulse has an energy area density of 1.1E.

5. The method of claim 3 wherein said solid is selected from the group consisting of silicon and germanium.

6. The method of claim 5 wherein said impurity is present in a concentration of $100^{14}$ to $10^{18}$ atoms of impurity per cubic centimeter of solid.

7. The method of claim 5 wherein said impurity is present in a concentration of $10^{15}$ to $10^{17}$ atoms of impurity per cubic centimeter of solid.

* * * * *